(12) United States Patent
Ito et al.

(10) Patent No.: US 8,390,498 B2
(45) Date of Patent: Mar. 5, 2013

(54) COMPARING CIRCUIT AND PARALLEL ANALOG-TO-DIGITAL CONVERTER

(75) Inventors: Tomohiko Ito, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/207,121

(22) Filed: Aug. 10, 2011

(65) Prior Publication Data

US 2012/0235844 A1    Sep. 20, 2012

(30) Foreign Application Priority Data

Mar. 16, 2011  (JP) .................................. 2011-58312

(51) Int. Cl.
*H03M 1/12*    (2006.01)
(52) U.S. Cl. ......... 341/155; 341/118; 341/158; 341/159
(58) Field of Classification Search .................. 341/155, 341/158, 159
See application file for complete search history.

(56) References Cited

U.S. PATENT DOCUMENTS

| | | | | |
|---|---|---|---|---|
| 4,270,118 | A | * | 5/1981 | Brokaw ........................ 341/159 |
| 4,533,903 | A | * | 8/1985 | Yamada et al. ............... 341/156 |
| 5,861,829 | A | | 1/1999 | Sutardja |
| RE37,716 | E | | 5/2002 | Sutardja et al. |
| 7,940,200 | B2 | | 5/2011 | Ito et al. |

* cited by examiner

*Primary Examiner* — Khai M Nguyen
(74) *Attorney, Agent, or Firm* — Holtz, Holtz, Goodman & Chick, PC (57) ABSTRACT

First and second resistor series divide a predetermined voltage range to generate first reference voltages and second reference voltages, respectively. First and second switch controlling circuits select respective ones of the first reference voltages and the second reference voltages. A comparing unit generates a logical signal representing a logical value by comparing a combined transistor current based on the selected first and second reference voltages with a transistor current based on an input signal. The first switch controlling circuit specifies two adjacent first reference voltages where the logical value is inverted by sequentially selecting the first reference voltages, and determines to select one of the adjacent reference voltages. Te second switch controlling circuit specifies two adjacent second reference voltages where the logical value is inverted by sequentially selecting the second reference voltages, and determines to select one of the adjacent reference voltages.

8 Claims, 12 Drawing Sheets

| Voff(LSB) | SWITCH SERIES 41 | SWITCH SERIES 42 |
|---|---|---|
| -1 | 41_1 | 42_1 |
| -0.9 | 41_1 | 42_2 |
| -0.8 | 41_1 | 42_3 |
| -0.7 | 41_2 | 42_2 |
| -0.6 | 41_2 | 42_3 |
| -0.5 | 41_3 | 42_2 |
| -0.4 | 41_3 | 42_3 |
| -0.3 | 41_4 | 42_2 |
| -0.2 | 41_4 | 42_3 |
| -0.1 | 41_5 | 42_2 |
| 0 | 41_5 | 42_3 |
| 0.1 | 41_5 | 42_4 |
| 0.2 | 41_6 | 42_3 |
| 0.3 | 41_6 | 42_4 |
| 0.4 | 41_7 | 42_3 |
| 0.5 | 41_7 | 42_4 |
| 0.6 | 41_8 | 42_3 |
| 0.7 | 41_8 | 42_4 |
| 0.8 | 41_9 | 42_3 |
| 0.9 | 41_9 | 42_4 |
| 1 | 41_9 | 42_5 |

| Voff(LSB) | SWITCH SERIES 41 | SWITCH SERIES 42 | SWITCH SERIES 43 | SWITCH SERIES 44 |
|---|---|---|---|---|
| -1 | 41_1 | 42_1 | 43_1 | 44_1 |
| -0.9 | 41_1 | 42_1 | 43_1 | 44_2 |
| -0.8 | 41_1 | 42_1 | 43_2 | 44_1 |
| -0.7 | 41_1 | 42_1 | 43_2 | 44_2 |
| -0.6 | 41_1 | 42_2 | 43_1 | 44_2 |
| -0.5 | 41_1 | 42_2 | 43_2 | 44_1 |
| -0.4 | 41_1 | 42_2 | 43_2 | 44_2 |
| -0.3 | 41_2 | 42_1 | 43_2 | 44_2 |
| -0.2 | 41_2 | 42_2 | 43_1 | 44_2 |
| -0.1 | 41_2 | 42_2 | 43_2 | 44_1 |
| 0 | 41_2 | 42_2 | 43_2 | 44_2 |
| 0.1 | 41_2 | 42_2 | 43_2 | 44_3 |
| 0.2 | 41_2 | 42_2 | 43_3 | 44_2 |
| 0.3 | 41_2 | 42_3 | 43_2 | 44_2 |
| 0.4 | 41_3 | 42_2 | 43_2 | 44_2 |
| 0.5 | 41_3 | 42_2 | 43_2 | 44_3 |
| 0.6 | 41_3 | 42_2 | 43_3 | 44_2 |
| 0.7 | 41_3 | 42_3 | 43_2 | 44_2 |
| 0.8 | 41_3 | 42_3 | 43_2 | 44_3 |
| 0.9 | 41_3 | 42_3 | 43_3 | 44_2 |
| 1 | 41_3 | 42_3 | 43_3 | 44_3 |

COMPARING CIRCUIT AND PARALLEL ANALOG-TO-DIGITAL CONVERTER

CROSS REFERENCE TO RELATED APPLICATIONS

This application is based upon and claims the benefit of priority from the prior Japanese Patent Application No. 2011-58312, filed on Mar. 16, 2011, the entire contents of which are incorporated herein by reference.

FIELD

The embodiments of the present invention relate to a comparing circuit and a parallel analog-to-digital converter, and for example, to a method for correcting a DC offset voltage.

BACKGROUND

In comparing circuits which compare the magnitude relation between an input analog signal and a reference signal, convert a comparison result into a signal of logical level, and output the signal, there is a problem that an error occurs in a base reference voltage due to a DC offset voltage caused by manufacturing variations in a transistor used therein or the like.

For example, in parallel analog-to-digital converters which include a resistor series that generates voltages at given intervals and a plurality of comparing circuits that use the generated voltages as reference voltages, and convert an input analog signal to a digital signal, it is known that desired resolution cannot be obtained unless the error caused by the DC offset voltage is reduced to a value substantially smaller than minimum resolution (LSB).

The error is reduced by use of a DC offset voltage correcting technique, so that the resolution can be improved.

A conventional DC offset voltage correcting technique is performed by providing a plurality of reference voltages at intervals substantially smaller than the LSB, and shifting the reference voltage in a direction to cancel the generated DC offset voltage.

The above conventional technique, however, has a problem that the number of resistors configuring the resistor series that generates the plurality of reference voltages at voltage intervals substantially smaller than the LSB is increased, so that the circuit area is larger.

DETAILED DESCRIPTION

According to an aspect of the embodiments, there is provided a comparing circuit including an input terminal, a first resistor series, a first switch controlling circuit, a second resistor series, a second switch controlling circuit and a comparing unit.

The input terminal receives an input signal.

The first resistor series divides a predetermined voltage range to generate a plurality of first reference voltages.

The first switch controlling circuit selects a one of the first reference voltages.

The second resistor series divides the predetermined voltage range at intervals larger than intervals of the first reference voltages to generate a plurality of second reference voltages.

The second switch controlling circuit selects a one of the second reference voltages.

The comparing unit includes a first transistor that generates a current based on the first reference voltage selected by the first switch controlling circuit, a second transistor with a smaller aspect ratio than that of the first transistor that generates a current based on the second reference voltage selected by the second switch controlling circuit, and a third transistor that generates a current based on the input signal. The comparing unit generates a logical signal representing a logical value by comparing the current from the third transistor with a combined current from the first and second transistors.

The first switch controlling circuit specifies two adjacent first reference voltages where the logical value is inverted by sequentially selecting the first reference voltages in a state in which any one of the second reference voltages is selected by the second switch controlling circuit, and determines to select one of the two adjacent first reference voltages.

The second switch controlling circuit specifies two adjacent second reference voltages where the logical value is inverted by sequentially selecting the second reference voltages in a state in which the first reference voltage by the first switch controlling circuit is selected, and determines to select one of the two adjacent second reference voltages.

In the following, embodiments of the present invention will be described by reference to the drawings.

First, how the present inventors have conceived the embodiments of the present invention will be described.

Figure 1:
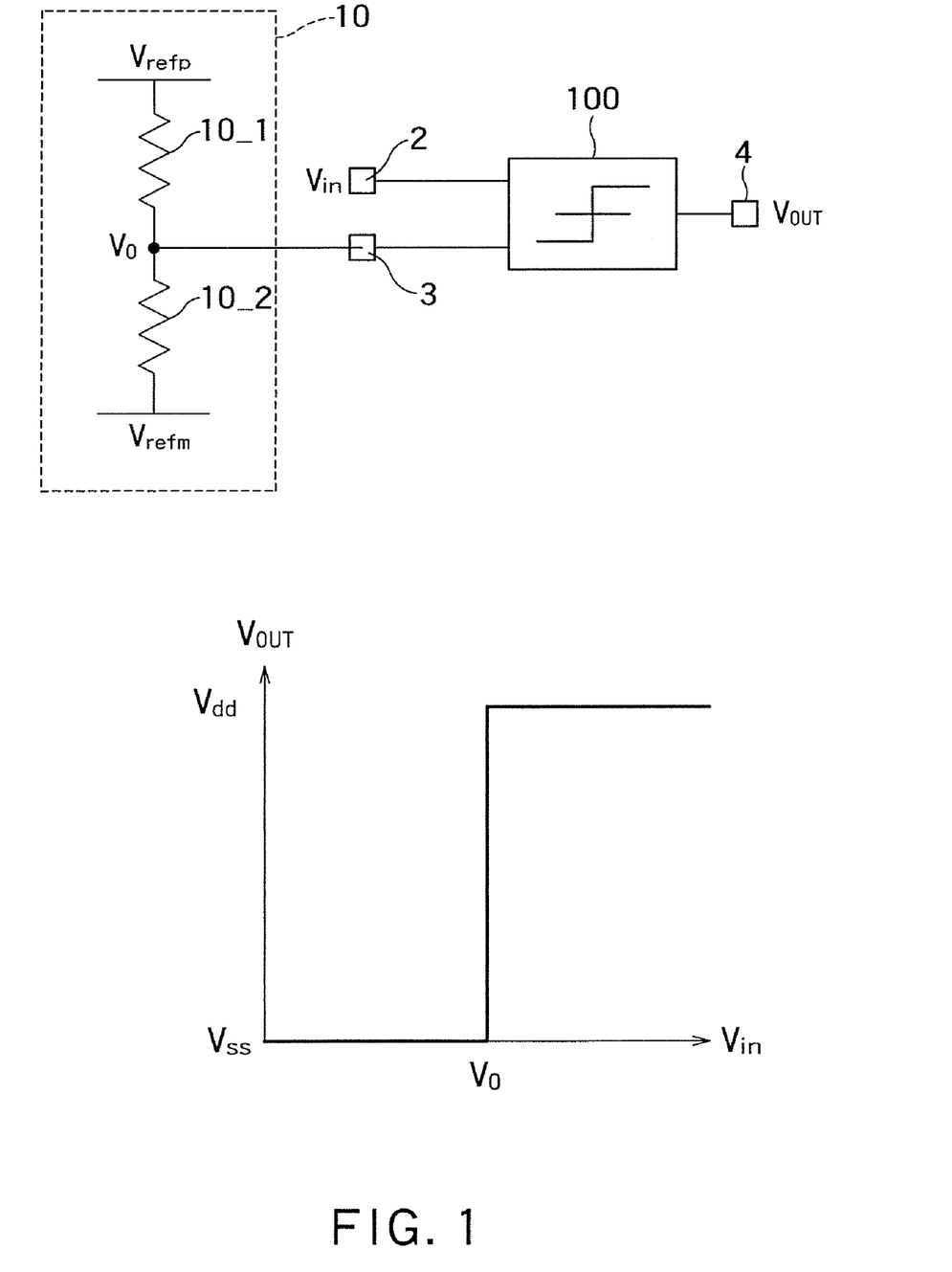
FIG. 1 is a circuit block diagram of an ideal 1-bit parallel analog-to-digital converter where no DC offset voltage is generated, and a graph showing the relation between an input signal and an output signal.

FIG. 1 shows an ideal 1-bit parallel analog-to-digital converter where no DC offset voltage is generated. A comparing unit 100 compares the magnitudes of an input voltage "Vin" input into an input terminal 2 and a reference voltage "Vo" input into an input terminal 3. An output terminal 4 outputs a voltage "Vss" corresponding to a logical value "0" when Vin≦Vo, and a voltage "Vdd" corresponding to a logical value "1" when Vin>Vo as an output voltage "Vout".

A voltage range of "Vin" is set to Vrefm≦Vin≦Vrefp. The reference voltage "Vo" is generated by dividing the voltage range between "Vrefp" and "Vrefm" by resistors 10_1 and 10_2 having an equal resistance value "R" in a reference voltage generating circuit 10. That is, Vo=(Vrefm+Vrefp)/2. As shown in a graph in FIG. 1, the value of "Vout" becomes a power supply potential "Vdd" or a ground potential "Vss" based on the magnitude relation between "Vin" and "Vo". At this time, 1 LSB (minimum resolution) is (Vrefp−Vrefm)/2.

Figure 2:
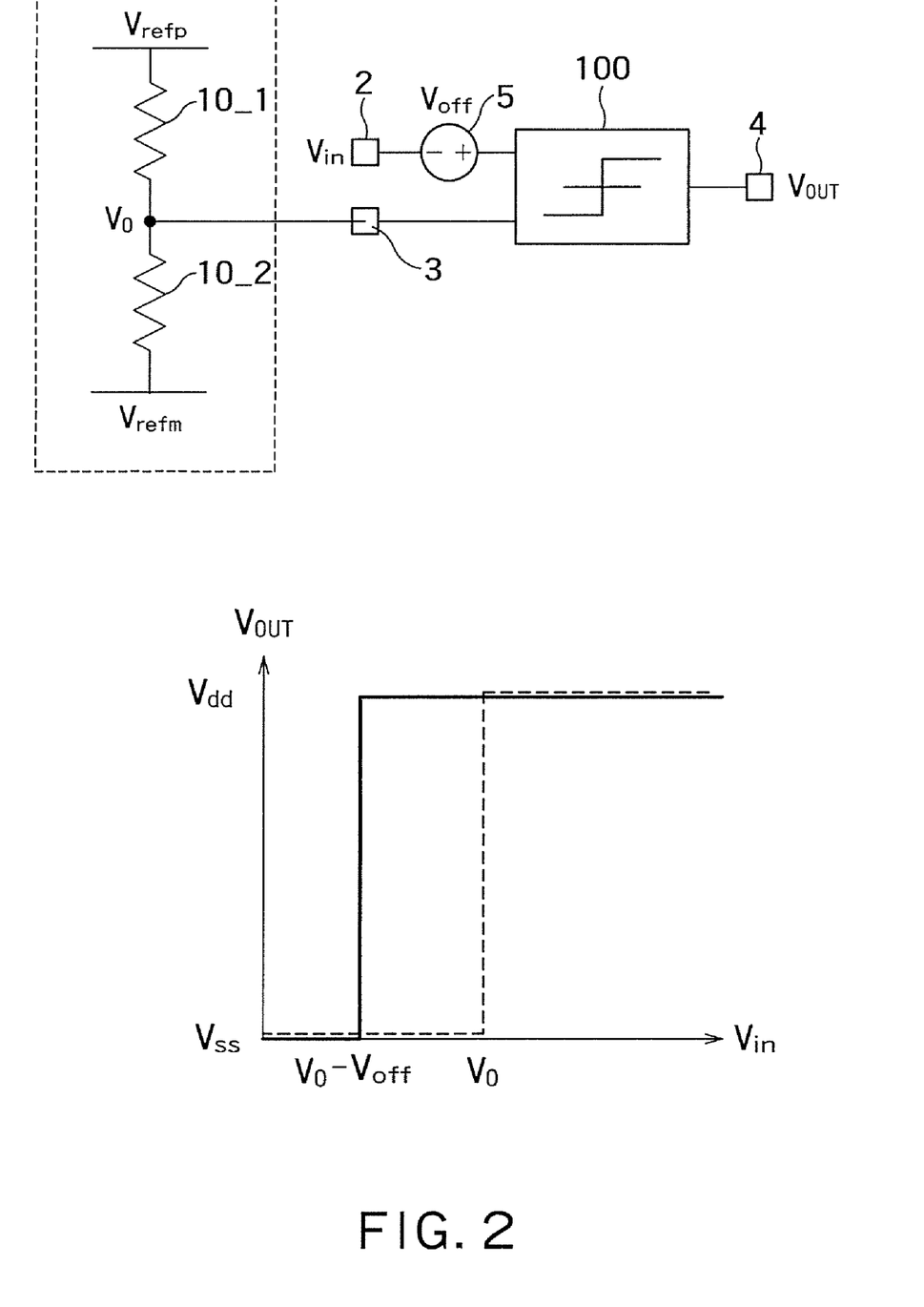
FIG. 2 is a circuit block diagram of a general 1-bit analog-to-digital converter where a DC offset voltage is generated, and a graph showing the relation between an input signal and an output signal.

FIG. 2 shows a general 1-bit analog-to-digital converter where a DC offset voltage is generated. A voltage source 5 indicates a DC offset voltage "Voff" obtained by converting the DC offset voltage generated in the comparing unit 100 into the input terminal 2. In this case, as shown in a graph in FIG. 2, the voltage is shifted from the ideal value "Vo". When Vin=Vo−Voff, the output from the comparing unit 100 is changed from "Vss" to "Vdd". As a result, the resolution of the analog-to-digital converter is deteriorated.

Figure 3:
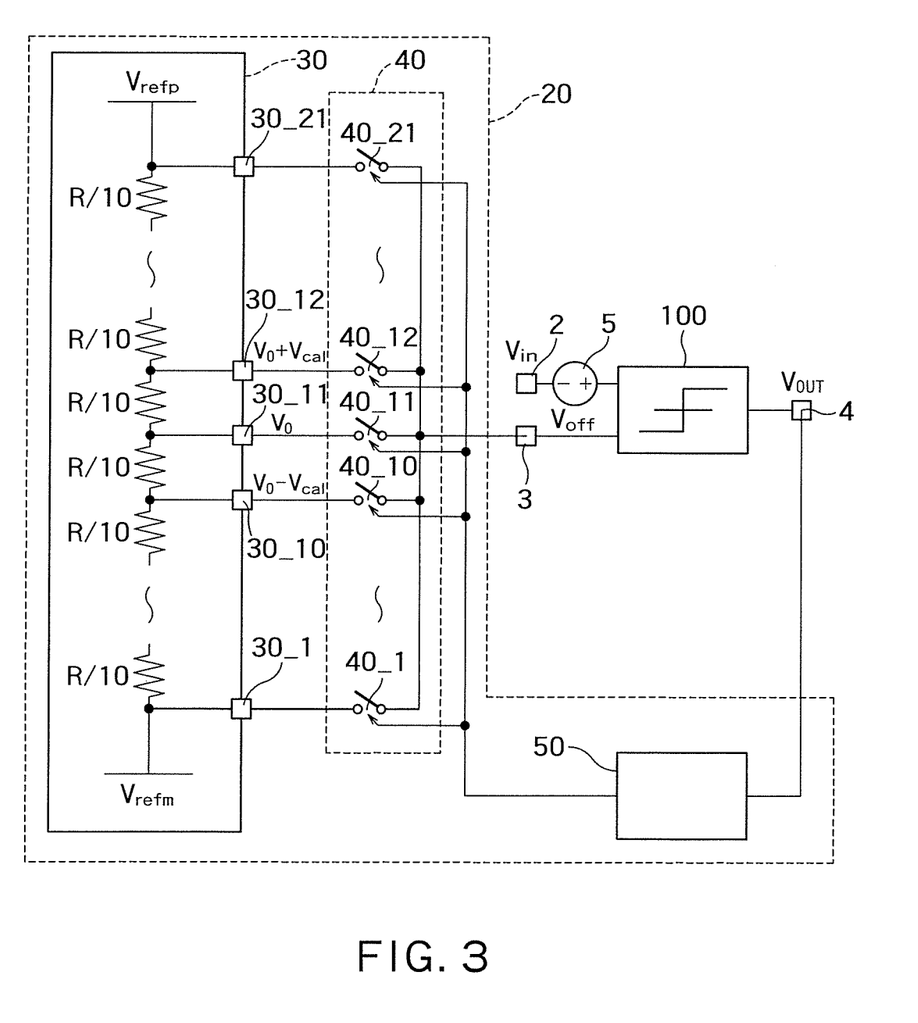
FIG. 3 is a block diagram of a circuit in which a DC offset voltage correcting circuit is added to a parallel analog-to-digital converter.

FIG. 3 shows a circuit in which a DC offset voltage correcting circuit 20 is added to the parallel analog-to-digital converter in FIG. 2. The DC offset voltage correcting circuit 20 includes a reference voltage generating circuit 30, a switch group 40, and a switch controlling circuit 50.

The reference voltage generating circuit 30 outputs a total of 21 types of voltages at equal intervals of "Vcal=+0.1 LSB" with "Vo" as the center between the voltage range of "Vrefp" and "Vrefm" of "Vin" from terminals 30_1 to 30_21. A voltage from a terminal 30_K+1 ("K" is an integral number, K=1 to 20) is larger than a voltage from a terminal 30_K by "Vcal".

Switches 40_1 to 40_21 of the switch group 40 are respectively connected between the terminals 30_1 to 30_21 and the input terminal 3.

The switch controlling circuit 50 short-circuits (ON) only one of the switches 40_1 to 40_21 and open-circuits (OFF) the other switches based on the value of the output voltage "Vout" from the comparing unit 100 in a DC offset voltage correcting operation. The switches 40_1 to 40_21 are ON/OFF controlled such that the reference voltage is increased by 1 level ("Vcal") when the output voltage "Vout" is "Vdd" and on the contrary, decreased by 1 level when "Vout" is "Vss".

The DC offset voltage correcting circuit 20 is operated as described below, for example. First, the base ideal voltage "Vo" is input into the input terminal 2. Meanwhile, by turning ON the switch 40_11, "Vo" is input into the input terminal 3 from the reference voltage generating circuit 30 as an initial value.

When Voff>0V, the input voltage is larger than the reference voltage by the offset voltage "Voff". Thus, the output voltage "Vout" from the comparing unit 100 is "Vdd". Since "Vout" is "Vdd", the switch controlling circuit 50 turns OFF the switch 40_11, and turns ON the switch 40_12 instead. By the ON/OFF operation, the voltage into the input terminal 3 is increased by "Vcal=+0.1 LSB" to be "Vo+Vcal". The above operation is repeated until "Vout" is inverted to "Vss".

When "Vout" is inverted, the switch controlling circuit 50 subsequently turns ON/OFF the switches of the switch group 40 such that the voltage into the input terminal 3 is decreased by "Vcal", so that Vout=Vdd. When the above state is obtained, "Vdd" and "Vss" are alternately output as "Vout" as a steady state.

In the steady state, a difference between the reference voltage of the comparing unit 100 and the ideal value "Vo" is within "±Vcal". The DC offset correcting operation is terminated while maintaining the ON/OFF state. The reference voltage of the comparing unit 100 is thereby corrected to within a residual error range of ±0.1 LSB from the ideal value "Vo". The resolution is thereby improved.

A correction range of "Voff" in the DC offset correcting method is determined by the voltage range generated by the reference voltage generating circuit 30. In the aforementioned example, the range is −1/2(Vrefp−Vrefm)≦Voff≦1/2 (Vrefp−Vrefm), that is, −1 LSB to 1 LSB.

However, in the DC offset correcting method, the number of resistors used in the reference voltage generating circuit 30 for generating the voltages at intervals of "Vcal" is increased. For example, in the case of FIG. 3, 20 resistors having a resistance value "R/10" are required. The number is 10 times that of the case in FIG. 1. In consideration of variations in the resistors, an area per one resistor used in the reference voltage generating circuit cannot be changed a lot. Thus, the increase in the number of resistors causes an increase in circuit area. Furthermore, transistors have been gradually reduced in size along with the recent development of process miniaturization technology. However, reduction in the areas of passive elements such as resistors has not been advanced. Thus, the increase in the number of resistors causes a relatively greater influence on the circuit area.

As described above, when the DC offset correcting method described using FIG. 3 is used, the plurality of voltages smaller than the LSB need to be provided by using the resistor series. There occurs a problem that the number of resistors used therein is increased, and the circuit area becomes larger.

To solve the problem, the embodiments of the present invention provide a method for correcting a DC offset voltage, which allows a circuit area to be decreased while maintaining a DC offset voltage correction range and a residual error range as before.

First Embodiment

Figure 4:
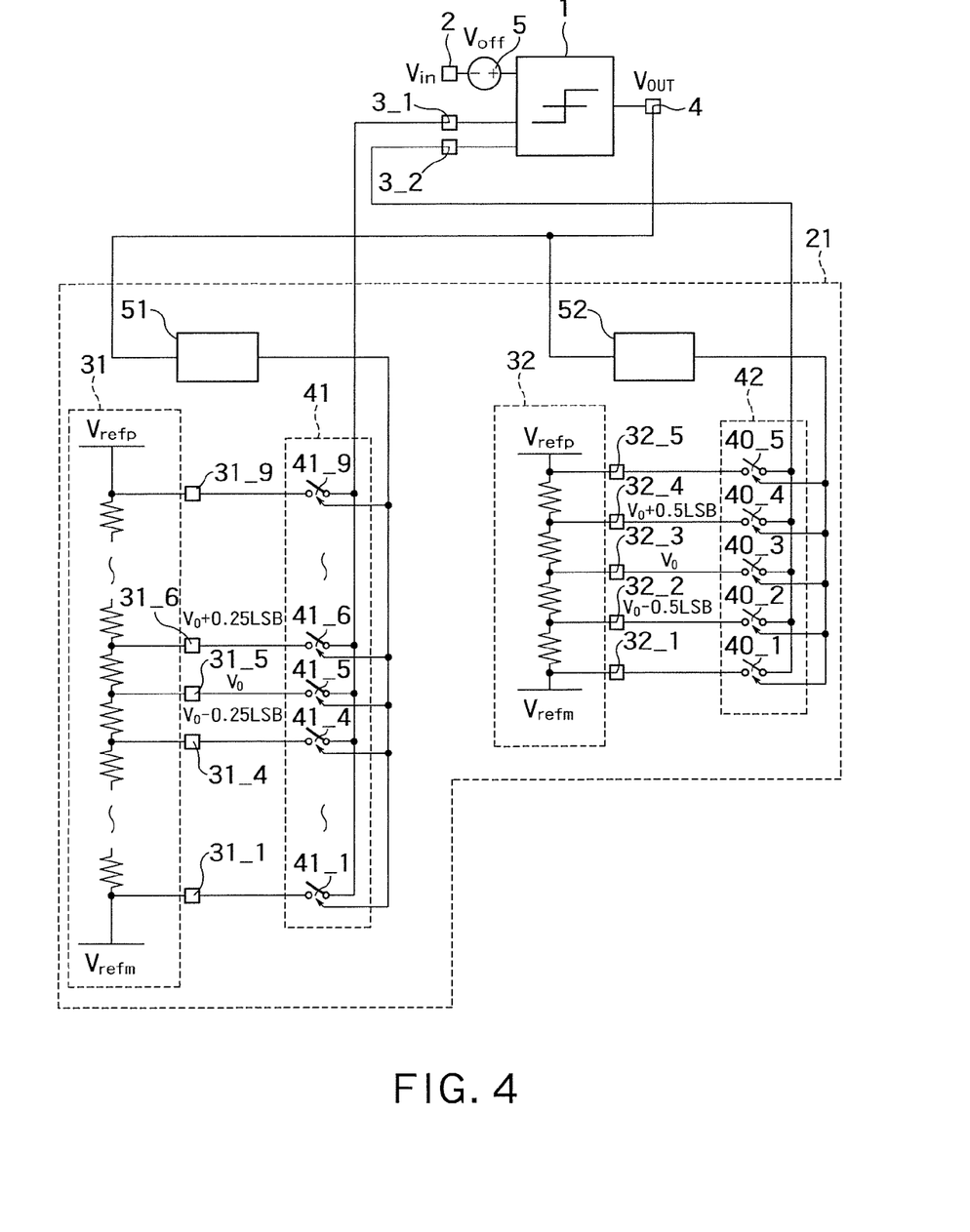
FIG. 4 is a circuit block diagram of a comparing circuit including a DC offset voltage correcting circuit according to a first embodiment.

FIG. 4 is a circuit block diagram of a comparing circuit according to a first embodiment.

A comparing unit 1 includes signal input terminals 2, 3_1 and 3_2, and a signal output terminal 4. An input voltage "Vin" is input from the terminal 2 as an input signal. First and second reference voltages are respectively input into the terminals 3_1 and 3_2.

A voltage range of "Vin" is set to Vrefm≦Vin≦Vrefp in a similar manner to FIG. 3. A logical signal representing a logical value of the comparing unit 1 is output from the signal output terminal 4. A value obtained by converting a DC offset voltage generated in the comparing unit 1 into an input into the terminal 2 is represented as "Voff", which is indicated by a voltage source 5.

A DC offset voltage correcting circuit 21 includes reference voltage generating circuits 31 and 32, switch groups 41 and 42, and switch controlling circuits 51 and 52.

The reference voltage generating circuit 31 includes a first resistor series in which a plurality of resistors are connected in series. The reference voltage generating circuit 31 divides a predetermined voltage range ("Vrefp" to "Vrefm" here) by the first resistor series, to generate a plurality of reference voltages (first reference voltages). To be more specific, a total of 9 types of voltages are generated at equal intervals of "Vcal=+0.25 LSB" with "Vo" as the center between the voltage range of "Vrefp" and "Vrefm" of the input voltage "Vin". The generated voltages are output from output terminals 31_1 to 31_9. An output voltage from an output terminal 31_K+1 ("K" is an integral number, K=1 to 8) is larger than an output voltage from an output terminal 31_K by 0.25 LSB.

Switches 41_1 to 41_9 of the switch group 41 are respectively connected between the input terminal 3_1 and output terminals 31_1 to 31_9. One of the switches 41_1 to 41_9 of the switch group 41 is turned ON, and the other switches are turned OFF under control of the switch controlling circuit 51. One of the voltages generated in the reference voltage generating circuit 31 is thereby selected. The switch group 41 corresponds to a first switch group, for example.

The reference voltage generating circuit 32 includes a second resistor series in which a plurality of resistors are connected in series. The reference voltage generating circuit 32 divides the predetermined voltage range at intervals larger than those of the reference voltage generating circuit 31, to generate a plurality of reference voltages (second reference voltages). To be more specific, a total of 5 types of voltages are generated at equal intervals of "Vcal=+0.5 LSB" with "Vo" as the center between the voltage range of "Vrefp" and "Vrefm" of the input voltage "Vin". The generated voltages are output from output terminals 32_1 to 32_5. An output voltage from an output terminal 32_K+1 ("K" is an integral number, K=1 to 4) is larger than an output voltage from an output terminal 32_K by 0.5 LSB.

Switches 42_1 to 42_5 of the switch group 42 are respectively connected between the output terminals 32_1 to 32_5 and the input terminal 3_2.

The switch controlling circuit 51 short-circuits (ON) only one of the switches 41_1 to 41_9 and open-circuits (OFF) the other switches based on an output voltage "Vout" from the comparing unit 1 in a DC offset voltage correcting operation. One of the plurality of reference voltages generated in the reference voltage generating circuit 31 is thereby selected. The selected reference voltage is input into the input terminal 3_1. The switch controlling circuit 51 corresponds to a first switch controlling circuit, for example.

The switch controlling circuit 52 short-circuits (ON) only one of the switches 42_1 to 42_5 and open-circuits (OFF) the other switches based on the output voltage "Vout" from the comparing unit 1 in the DC offset voltage correcting operation. One of the plurality of reference voltages generated in the reference voltage generating circuit 32 is thereby selected. The selected reference voltage is input into the input terminal 3_2. The switch controlling circuit 52 corresponds to a second switch controlling circuit, for example.

The control of the switch group 41 by the switch controlling circuit 51 and the control of the switch group 42 by the switch controlling circuit 52 are respectively the same as the control of the switch group 40 by the switch controlling circuit 50 shown in FIG. 3.

That is, the switches are turned ON/OFF such that the reference voltage is increased by 1 level when the output voltage "Vout" is "Vdd", and on the contrary, decreased by 1 level when "Vout" is "Vss". Here, the order of operation is determined. The switch controlling circuit 51 is operated first, and the switch controlling circuit 52 is subsequently operated. The switch controlling circuit 51 and the switch controlling circuit 52 are not operated at the same time.

Figure 5:
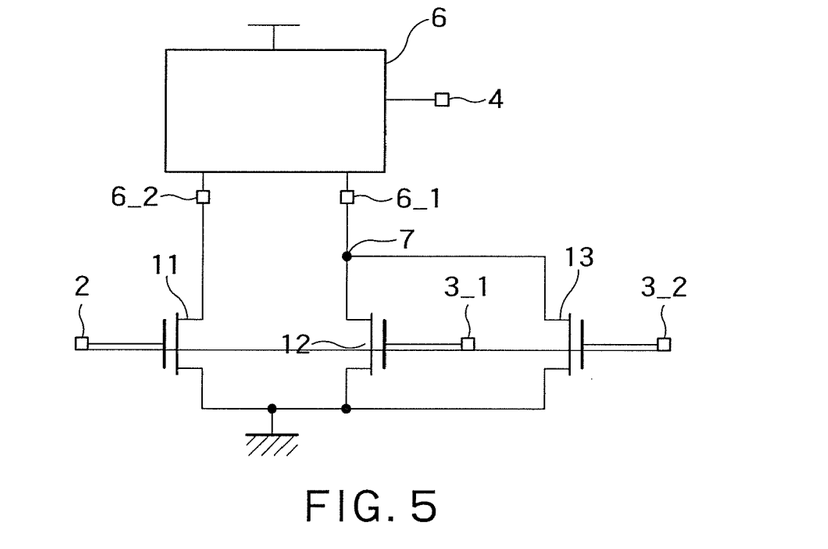
FIG. 5 is a circuit diagram of the comparing circuit according to the first embodiment.

FIG. 5 shows a circuit configuration of the comparing unit 1 shown in FIG. 4.

The input voltage (the input signal) is input into the gate terminal 2 of an NMOS transistor 11. The reference voltages from the reference voltage generating circuits 31 and 32 are respectively input into the gate terminals 3_1 and 3_2 of NMOS transistors 12 and 13 via the switch groups 41 and 42. An aspect ratio of the NMOS transistor 13 is smaller than an aspect ratio of the NMOS transistor 12.

The NMOS transistor 12 generates a current based on the input reference voltage. The NMOS transistor 12 corresponds to a first transistor, for example. Similarly, the NMOS transistor 13 generates a current based on the input reference voltage. The NMOS transistor 13 corresponds to a second transistor, for example. The NMOS transistor 11 generates a current based on the input voltage. The NMOS transistor 11 corresponds to a third transistor, for example.

The aspect ratios of the NMOS transistors 11, 12 and 13 are set to 1:0.8:0.2. Source terminals of the NMOS transistors 11 to 13 are grounded to "Vss". A current input terminal 6_2 of a latch circuit 6 is connected to a drain terminal of the NMOS transistor 11. The current generated by the NMOS transistor 11 is input into the terminal 6_2. An input terminal 6_1 of the latch circuit 6 is connected to both drain terminals of the NMOS transistors 12 and 13. The currents from the NMOS transistors 12 and 13 are combined at a combining point 7, and the combined current is provided to the terminal 6_1.

The latch circuit 6 compares the magnitudes of the current input into the terminal 6_1 and the current input into the terminal 6_2, and outputs a comparison result from the output terminal 4. When the input current into the terminal 6_2 is larger than the input current into the terminal 6_1, the terminal 4 outputs "Vdd" corresponding to a logical value "1". In an opposite case, the terminal 4 outputs "Vss" corresponding to a logical value "0".

Figure 6:
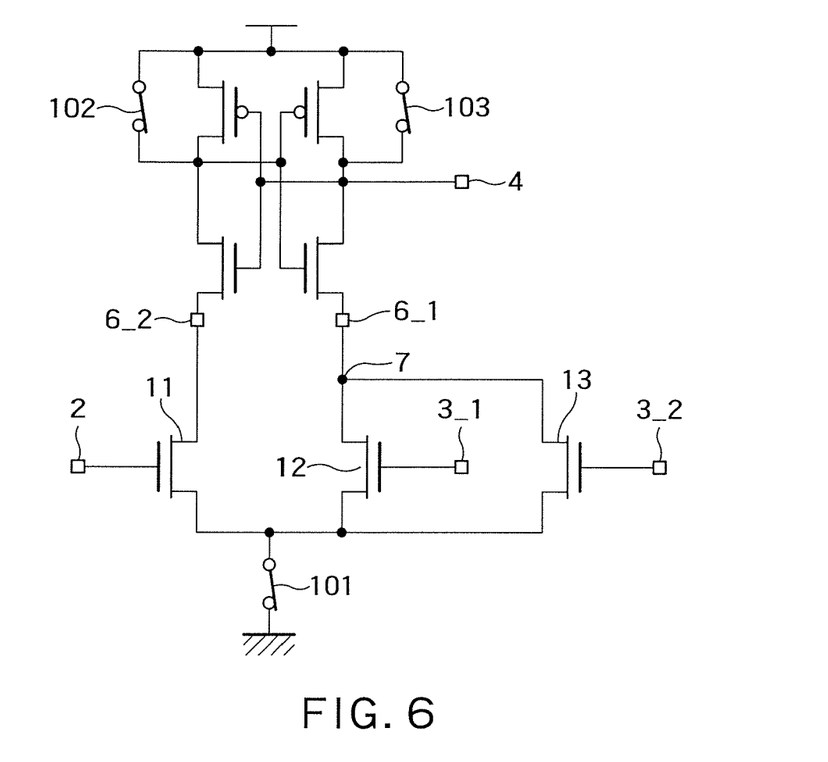
FIG. 6 is a diagram illustrating a circuit configuration example of a latch circuit used in the comparing circuit in FIG. 5.

FIG. 6 shows a specific configuration example of the comparing unit 1. When a switch 101 is turned ON and switches 102 and 103 are turned OFF at the same time, a comparison operation is started. When the switch 101 is turned OFF and the switches 102 and 103 are turned ON at the same time, the output terminal 4 is reset to a power supply voltage regardless of the previous value. The switches 101 to 103 repeatedly perform the comparison operation and the reset operation. The source terminals of the NMOS transistors 11 to 13 may be also grounded without providing the switch 101.

The DC offset voltage correcting circuit 21 in FIG. 4 performs the correcting operation as described below. First, the switch controlling circuit 51 is operated after inputting the ideal value "Vo" into the terminal 2. As an initial value, the switch 42_3 of the switch group 42 is turned ON, to input "Vo" into the gate terminal 3_2 of the NMOS transistor 13. The switch 42_3 is a switch for selecting a middle voltage in the voltage range. The present embodiment is also effective in a case in which a voltage other than the middle voltage is selected.

The switch controlling circuit 51 controls the switches 41_1 to 41_9 such that the reference voltage input into the gate terminal 3_1 of the NMOS transistor 12 cancels the equivalent input DC offset voltage "Voff" indicated by the voltage source 5 based on the value of the output voltage "Vout" from the comparing unit 1.

For the sake of simplicity, transconductances (input voltage-to-output current conversion ratios) of the NMOS transistors 11 to 13 are assumed to be proportional to the aspect ratios. The aspect ratio of the NMOS transistor 12 is 0.8 times that of the NMOS transistor 11. Thus, an increase in drain current obtained when the reference voltage input into the gate of the NMOS transistor 12 is shifted from the ideal value "Vo" by +1 LSB is equal to an increase in drain current obtained when the gate voltage into the NMOS transistor 11 is shifted from the ideal value "Vo" by +0.8 LSB. The DC offset voltage correction on the comparing unit 1 by the reference voltage generating circuit 31 is effectively performed by a correction unit of 0.8×0.25=0.2 LSB and within a correction range of −0.8 LSB to 0.8 LSB.

When the DC offset correcting operation is brought into a steady state, the switch controlling circuit 51 stops operation. At this time, the ON/OFF state of the switch group 41 in the steady state is maintained. Accordingly, the switch controlling circuit 51 specifies two adjacent reference voltages where the logical value output from the comparing unit 1 is inverted, and sets the switch group such that any one of the specified two reference voltages is output.

Subsequently, to further reduce the residual DC offset voltage, the switch controlling circuit 52, the reference voltage generating circuit 32, and the switch group 42 are used to perform a similar DC offset voltage correcting operation on the reference voltage input into the gate terminal of the NMOS transistor 13 while maintaining the state of the switch group 41 in the steady state. That is, the switch controlling circuit 52 sets the switch group such that one of two adjacent reference voltages where the logical value output from the comparing unit 1 is inverted is output. While the reference voltage into the NMOS transistor 13 is switched per 0.5 LSB, the aspect ratio of the NMOS transistor 13 is 0.2 times that of the NMOS transistor 11. Thus, the DC offset correction on the comparing unit 1 by the reference voltage generating circuit 32 is effectively performed by a correction unit of 0.2×0.5=0.1 LSB and within a correction range of −0.2 LSB to 0.2 LSB.

When the DC offset correcting operation is brought into a steady state, the switch controlling circuit 52 stops operation. At this time, the state of the switch group 42 in the steady state is maintained.

A total adjustment range by the DC offset voltage correcting circuit 21 is −(0.8+0.2) LSB to (0.8+0.2) LSB. A minimum correction range is 0.1 LSB as the correction unit in the transistor 13. The value is equal to that of the DC offset voltage correction range shown in FIG. 3.

Figure 7:
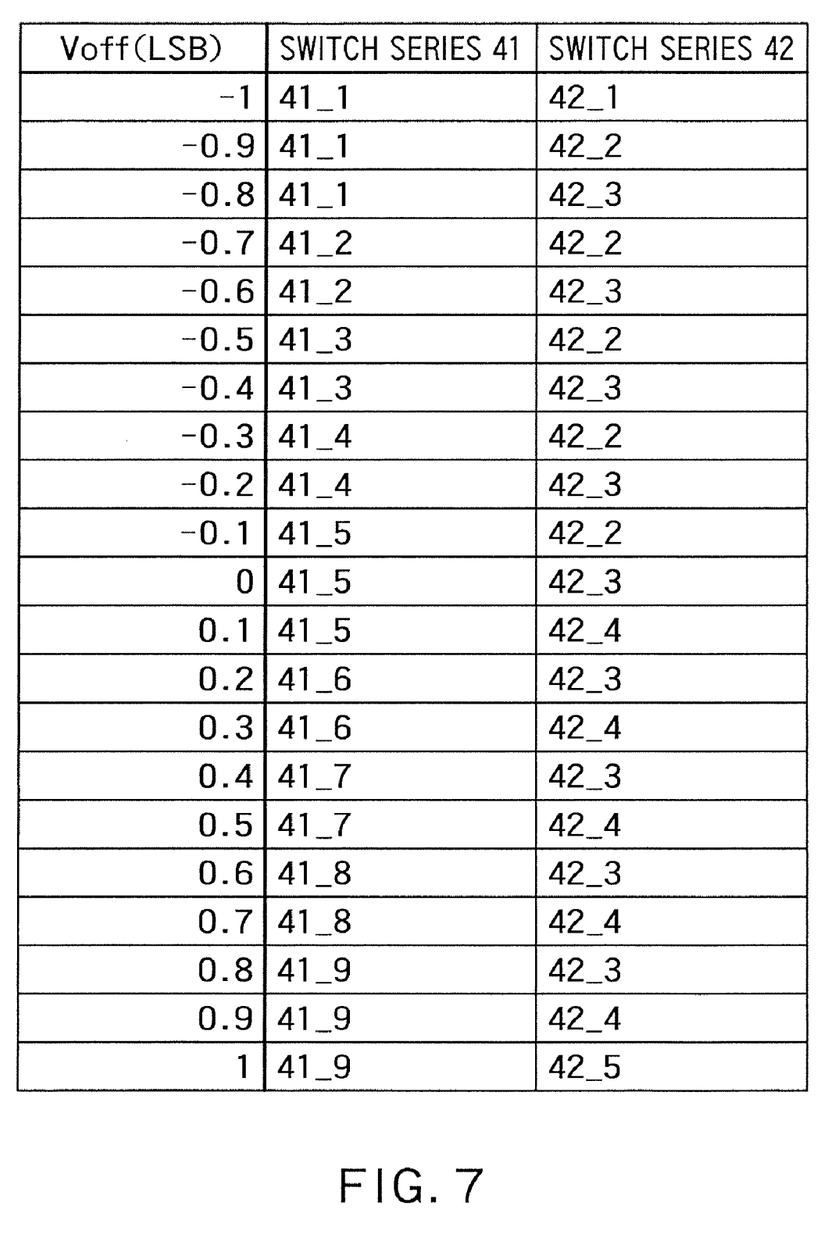
FIG. 7 is a view showing a list of switches which are short-circuited when various equivalent input offset voltages are corrected by using the offset voltage correcting circuit.

For example, when Voff=−1 LSB, . . . , 0.1 LSB, 0.2 LSB, . . . , and 1 LSB, the switches shown in FIG. 7 are ON in the steady state. For example, a case in which Voff=0.5 LSB will be described.

Since the input voltage into the comparing unit 1 can be considered as Vo+0.5 LSB, the switch controlling circuit 51 turns ON the switch 41_7, to increase the gate voltage into the input terminal 3_1 by 0.5 LSB from "Vo". At this time, an offset voltage of 0.8×0.5=0.4 LSB is effectively corrected.

When the switch 41_8 is turned ON, the gate voltage into the NMOS transistor 12 is effectively increased to 0.6 LSB, which exceeds the magnitude of the DC offset. Thus, the logical value output from the comparing unit 1 is inverted again. As a result, the switch 41_7 and the switch 41_8 are alternately turned ON/OFF in the steady state. The reference voltage from the switch 41_7 and the reference voltage from the switch 41_8 are in a relation to invert the logical value output from the comparing unit 1 from that of each other.

When the switch 41_7 is ON immediately before the operation termination of the switch controlling circuit 51, the switch controlling circuit 51 stores and maintains the ON state of the switch 41_7. The residual DC offset becomes 0.1 LSB. The switch controlling circuit 52 is operated in this state. When the switch 41_8, not the switch 41_7, is ON, the switch controlling circuit 51 stores and maintains the ON state of the switch 41_8. As described above, the switch controlling circuit 51 sets the switch group such that one of the two reference voltages that invert the logical value output from the comparing unit 1 from that of each other is output.

When the switch 42_4 is turned ON, an offset voltage of 0.2×0.5=0.1 LSB is effectively corrected. The residual DC offset voltage thus becomes 0. Actually, a DC offset voltage having an absolute value less than 0.1 LSB remains without being corrected in the above DC offset correcting operation. Thus, the residual offset is within ±0.1 LSB.

As shown in FIG. 4, the number of resistors in the present embodiment is 12 in total in the reference voltage generating circuits 31 and 32. The number is reduced to half of that of the reference voltage generating circuit 30 in FIG. 3. The circuit area can be thereby decreased.

Although the reference voltage generating circuits 31 and 32 in FIG. 4 generate the reference voltages with different widths from each other in the present embodiment, the reference voltages with the same width (that is, the same value) may be also generated.

Second Embodiment

Figure 8:
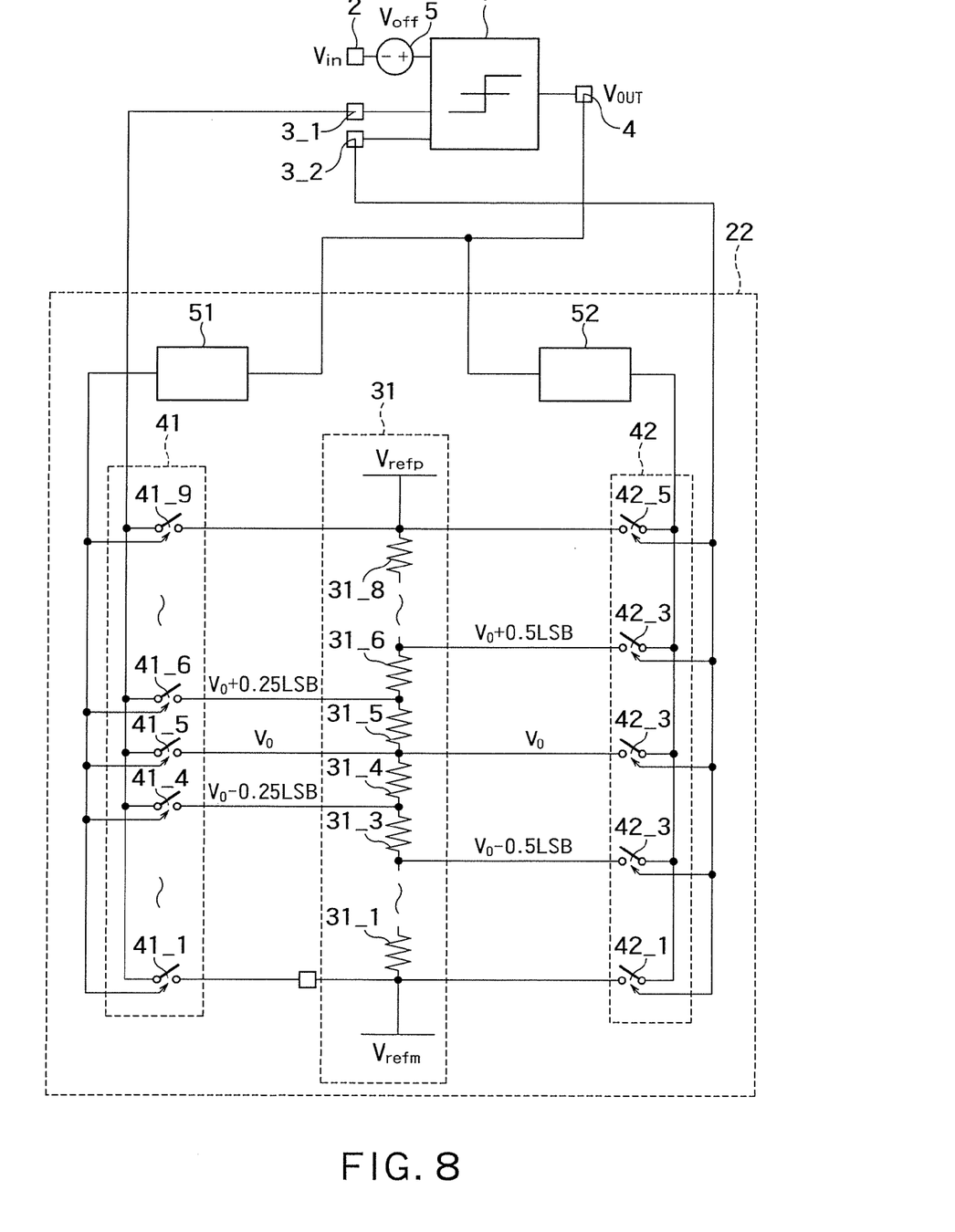
FIG. 8 is a circuit block diagram of a comparing circuit including a DC offset voltage correcting circuit according to a second embodiment.

FIG. 8 is a circuit block diagram of a comparing circuit according to a second embodiment. The reference voltage generating circuit 32 is removed therefrom. The switch group 42 along with the switch group 41 is connected to the resistor series of the reference voltage generating circuit 31. The switch group 42 selects a reference voltage not from all the reference voltages generated in the reference voltage generating circuit 31 but from a part of reference voltages at constant intervals in all the reference voltages.

By sharing the reference voltage generating circuit, the number of resistors used therein is 8, which is further reduced from that in FIG. 4. The circuit area can be thereby decreased.

Third Embodiment

Figure 9:
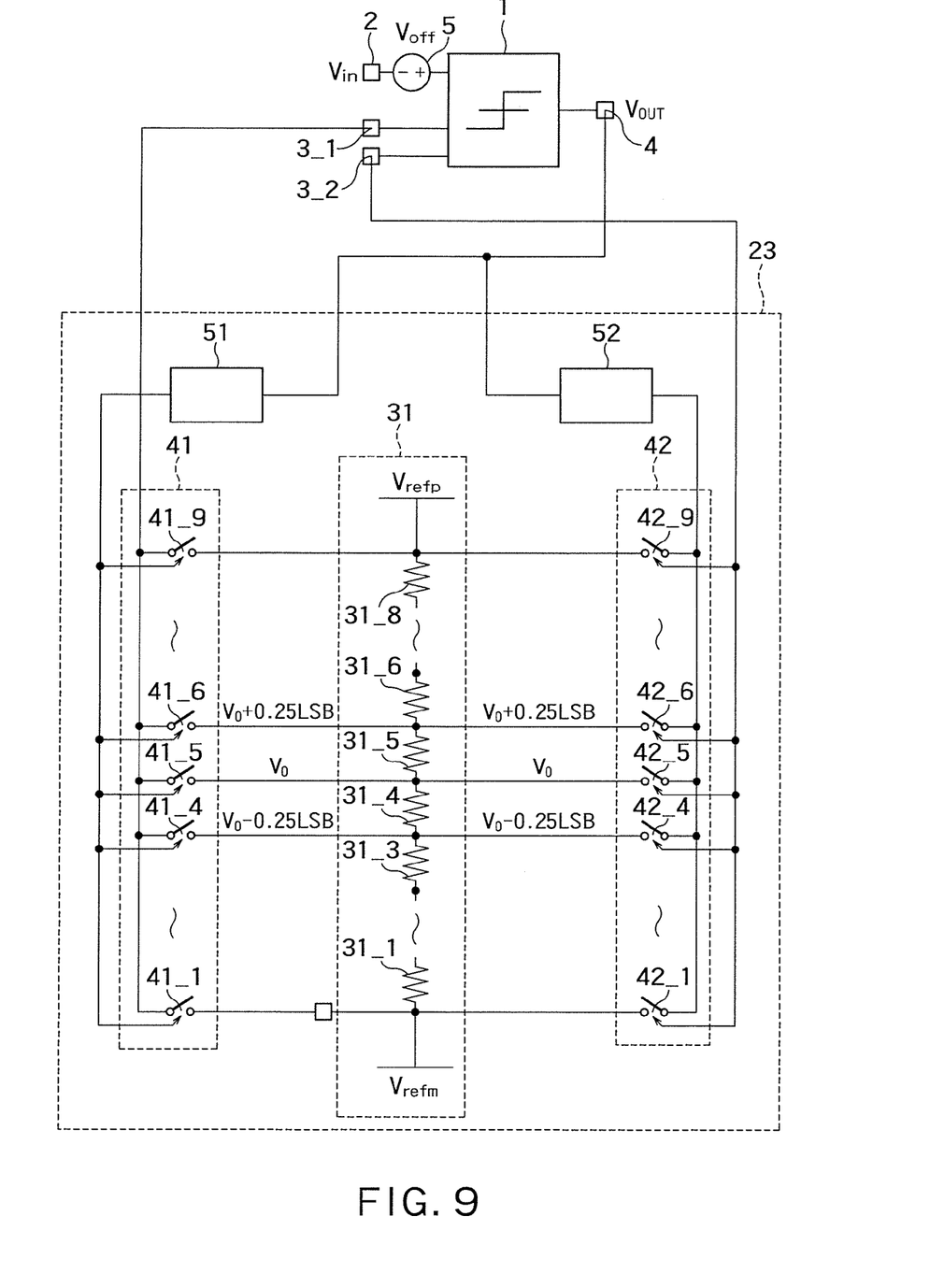
FIG. 9 is a circuit block diagram of a comparing circuit including a DC offset voltage correcting circuit according to a third embodiment.

FIG. 9 is a circuit diagram of a comparing circuit according to a third embodiment. The third embodiment differs from the second embodiment shown in FIG. 8 in that aspect ratios of the NMOS transistors 11 to 13 of the comparing unit 1 are 1:0.8:0.4, and the number of switches included in the switch group 42 is 9 in a similar manner to the switch group 41.

Transconductances (input voltage-to-output current conversion ratios) of the NMOS transistors 11 to 13 are assumed to be proportional to the aspect ratios. At this time, the DC offset voltage correction on the comparing unit 1 by using the switch controlling circuit 51 is effectively performed by a correction unit of 0.8×0.25=0.2 LSB and within a correction range of −0.8 LSB to 0.8 LSB in a similar manner to the first embodiment.

When the DC offset correcting operation is brought into a steady state, the switch controlling circuit 51 stops operation. At this time, the ON/OFF state of the switch group 41 in the steady state is maintained.

Subsequently, to further reduce the residual DC offset voltage, the switch controlling circuit 52, the reference voltage generating circuit 31, and the switch group 42 are used to perform a similar DC offset voltage correcting operation on the reference voltage input into the gate terminal of the NMOS transistor 13.

In the present embodiment, the reference voltage into the NMOS transistor 13 is switched per 0.25 LSB. The aspect ratio of the NMOS transistor 13 is 0.4 times that of the NMOS transistor 11. Thus, the DC offset correction on the comparing unit 1 by the reference voltage generating circuit 31 is effectively performed by a correction unit of 0.4×0.25=0.1 LSB, which is the same as those in the first and second embodiment. Meanwhile, a correction range is −0.4 LSB to 0.4 LSB, which is larger than those in the aforementioned first and second embodiments.

The DC offset correction range thereby acquires redundancy. Even if the residual DC offset voltage from the DC offset correction by the NMOS transistor 12 exceeds the correction unit of 0.2 LSB due to resistor variations in the resistor series or layout variations within the comparing unit 1 or the reference voltage generating circuit 31, the residual DC offset voltage can be corrected by the DC offset correction by the NMOS transistor 13. Accordingly, more accurate DC offset correction is enabled.

That is, a maximum value of a drain current change amount in the second transistor is larger than a minimum value of a current change amount in the first transistor. Thus, the minimum value in the adjustment range of the first transistor and the maximum value in the adjustment range of the second transistor acquire redundancy. That is, the correction ranges are made to overlap with each other. The circuit configuration is thereby less vulnerable to errors.

A total adjustment range by a DC offset voltage correcting circuit 23 is −(0.8+0.4) LSB to (0.8+0.4) LSB, which satisfies the DC offset voltage correction range described using FIG. 3. A minimum correction range by the DC offset voltage correcting circuit 23 is 0.1 LSB as the correction unit in the transistor 13, which is the same as the example in FIG. 3.

In FIG. 9, by sharing the reference voltage generating circuit in a similar manner to FIG. 8, the number of resistors used therein is 8, which is further reduced from that in FIG. 4. The circuit area can be thereby decreased.

Fourth Embodiment

Figure 10:
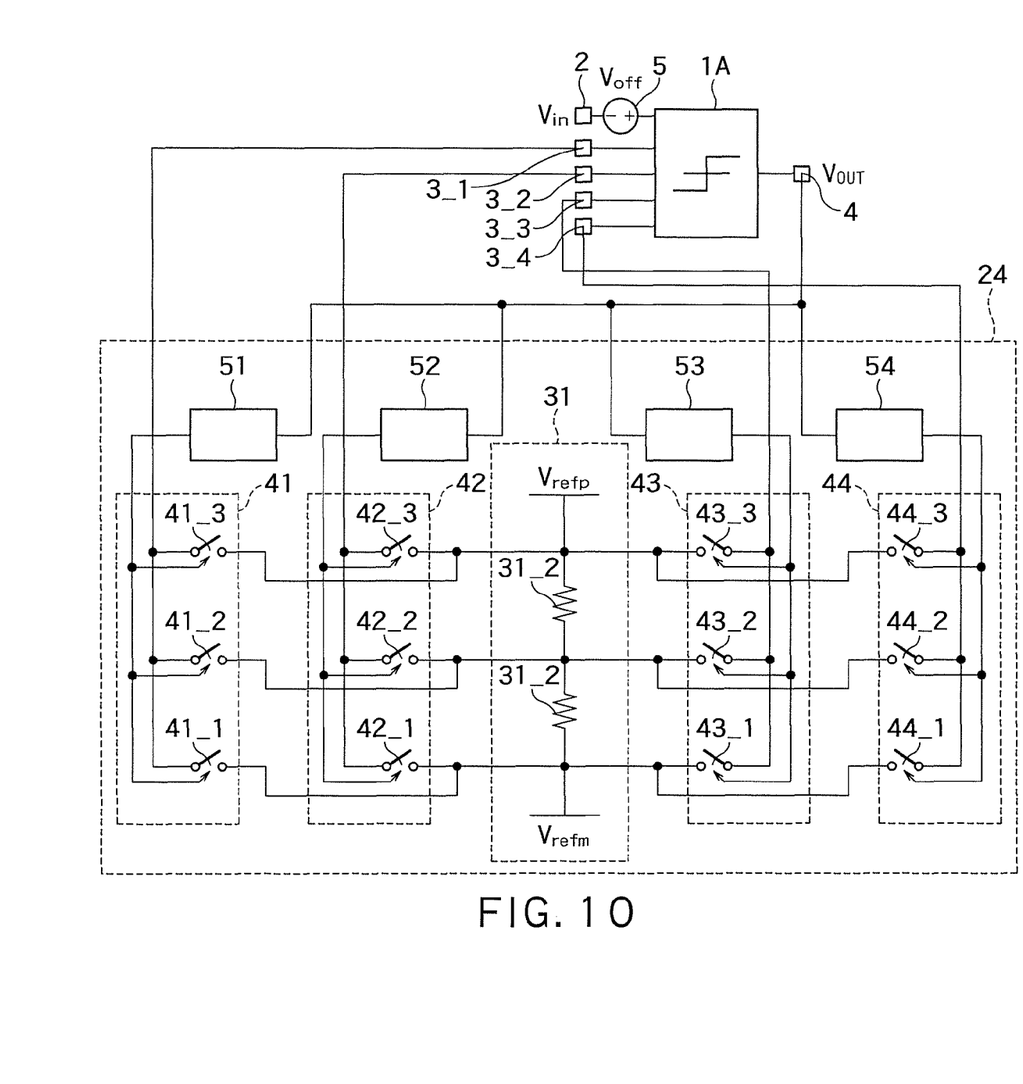
FIG. 10 is a circuit block diagram of a comparing circuit including a DC offset voltage correcting circuit according to a fourth embodiment.

FIG. 10 is a circuit block diagram of a comparing circuit according to a fourth embodiment.

A comparing unit 1A includes input signal terminals 2, 3_1, 3_2, 3_3, and 3_4, and an output terminal 4. A signal "Vin" is input from the terminal 2. Reference voltages are input into the terminals 3_1 to 3_4. A voltage range of "Vin" is set to Vrefm≦Vin≦Vrefp. A logical signal representing a logical value as a comparison result of the comparing unit 1A is output from the terminal 4. A value obtained by converting a DC offset in the comparing unit 1A into an input of the input terminal 2 is represented as "Voff", which is indicated by a voltage source 5.

Figure 11:
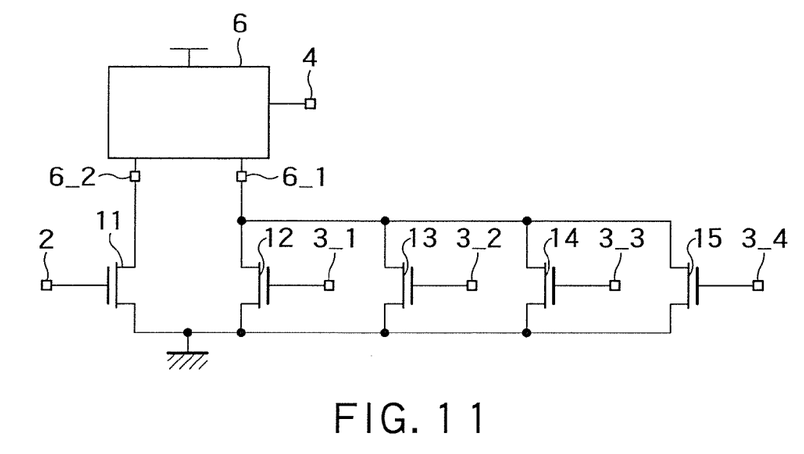
FIG. 11 is a circuit diagram of the comparing circuit according to the fourth embodiment.

FIG. 11 shows an example of a detailed circuit configuration of the comparing unit 1A.

An input voltage is input into the gate terminal of an NMOS transistor 11. Reference voltages from a reference voltage generating circuit (a first reference voltage generating circuit) 31 are respectively input into the gate terminals 3_1 to 3_4 of NMOS transistors 12 to 15 via switch groups 41 to 44.

Aspect ratios of the NMOS transistors 11 to 15 are set to 1:0.4:0.3:0.2:0.1. Source terminals of the NMOS transistors 11 to 15 are grounded to "Vss". A drain terminal of the NMOS transistor 11 is connected to a terminal 6_2 of a latch circuit 6. Drain terminals of the NMOS transistors 12 to 15 are all connected to a terminal 6_1 of the latch circuit 6.

A DC offset voltage correcting circuit 24 includes the reference voltage generating circuit 33, the switch groups 41 to 44, and switch controlling circuits 51 to 54. The switch controlling circuits 51 to 54 respectively turn ON only one switch configuring each of the switch groups 41 to 44. The switch controlling circuits are operated in the order of 51, 52, 53 and 54. The operation is equivalent to that in the first embodiment.

Figure 12:
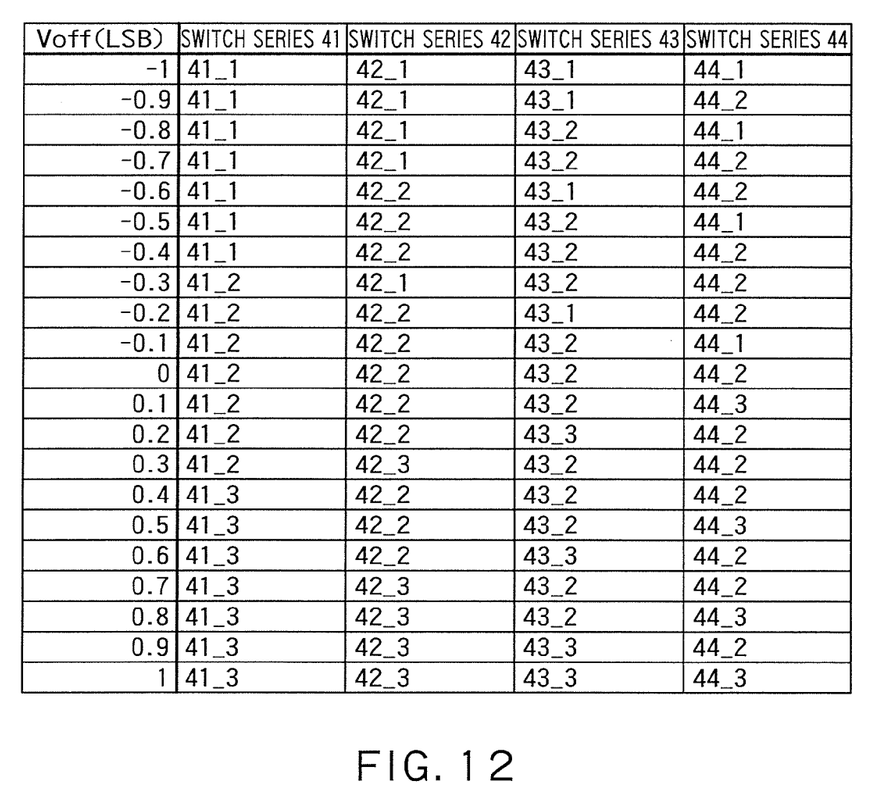
FIG. 12 is a view showing a list of switches which are short-circuited when various equivalent input offset voltages are corrected by using the offset voltage correcting circuit according to the fourth embodiment.

For example, when Voff=−1 LSB, . . . , 0.1 LSB, 0.2 LSB, . . . , and 1 LSB, the switches shown in FIG. 12 are ON in a steady state. The same DC offset voltage correction range and residual offset voltage as those of the first embodiment are obtained.

As shown in FIG. 10, the number of resistors used in the reference voltage generating circuit 33 is 2. The circuit area can be thereby further decreased.

Fifth Embodiment

Figure 13:
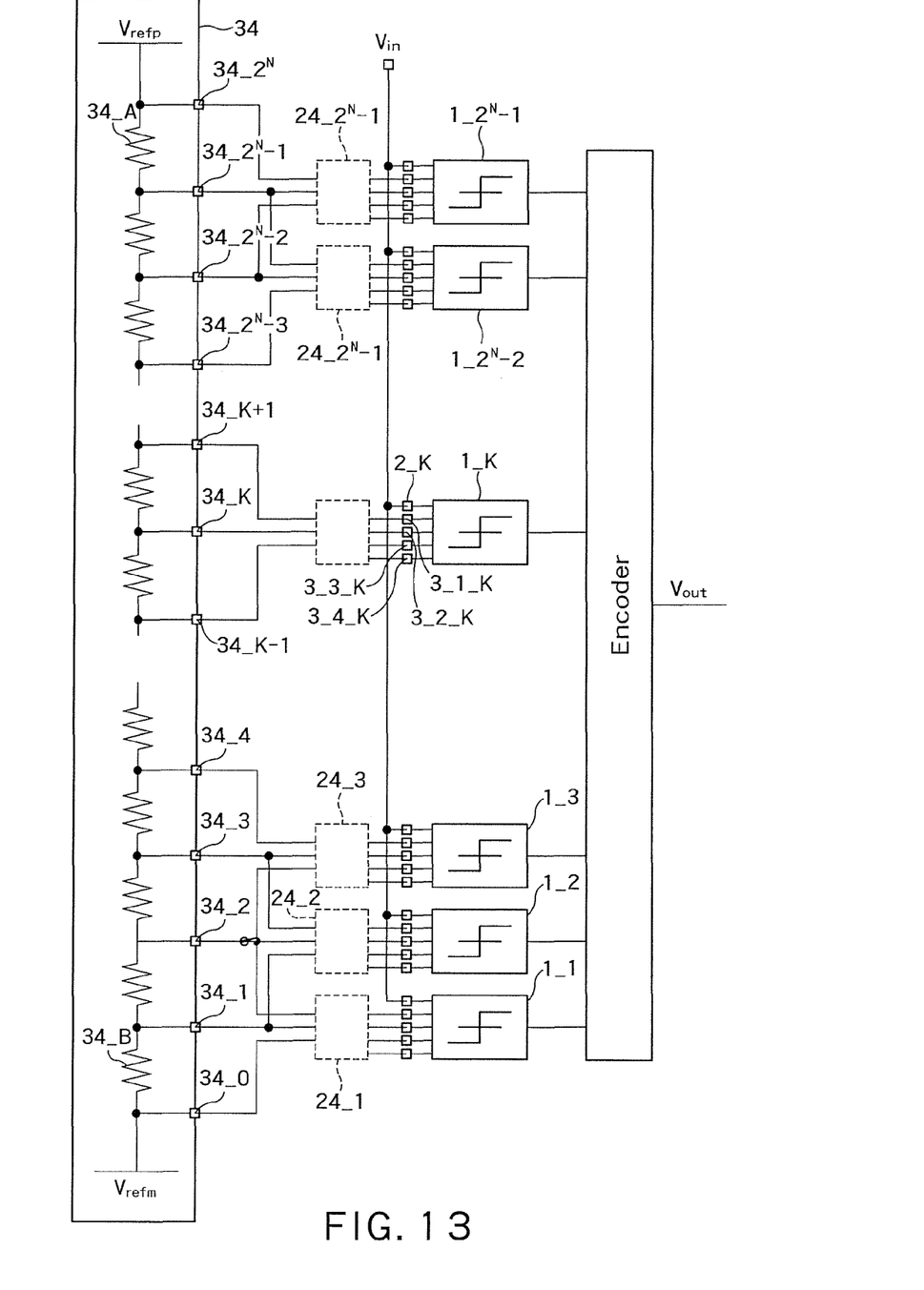
FIG. 13 is a circuit diagram of an N-bit parallel analog-to-digital converter according to a fifth embodiment.

FIG. 13 shows an N-bit parallel analog-to-digital converter circuit according to a fifth embodiment. A reference voltage generating circuit 34 generates voltages at intervals of 1 LSB in the parallel analog-to-digital converter circuit. The voltages are output from terminals 34_0 to 34_2$^N$.

A comparing unit having the same configuration as that of the comparing unit 1A in FIG. 10 is used as comparing units 1_1 to 1_2$^N$−1. Reference numerals 24_1 to 24_2$^N$−1 denote DC offset voltage correcting circuits corresponding to the comparing units 1_1 to 1_2$^N$−1.

For example, an input terminal 2_K, and input terminals 3_1_K to 3_4_K in a comparing unit 1_K (K=1 to 2$^N$−1) respectively correspond to the input terminals 2, and 3_1 to 3_4 of the comparing unit 1A in FIG. 10.

An ideal reference voltage where no DC offset voltage is generated is output from an input terminal 34_K. A voltage larger than the ideal reference voltage by 1 LSB is output from an input terminal 34_K+1. A voltage smaller than the ideal reference voltage by 1 LSB is output from an input terminal 34_K−1.

The reference voltages output from the input terminals 34_K−1, 34_K, and 34_K+1 are matched with "Vrefm", "Vo" and "Vrefp" generated in the reference voltage generating circuit 33 in FIG. 10, and used as reference voltages from a DC offset voltage correcting circuit 24_K to the comparing unit 1_K. Accordingly, the output from the comparing unit 1_K can be corrected to within a residual offset voltage of ±0.1 LSB within a range of ±1 LSB.

Figure 14:
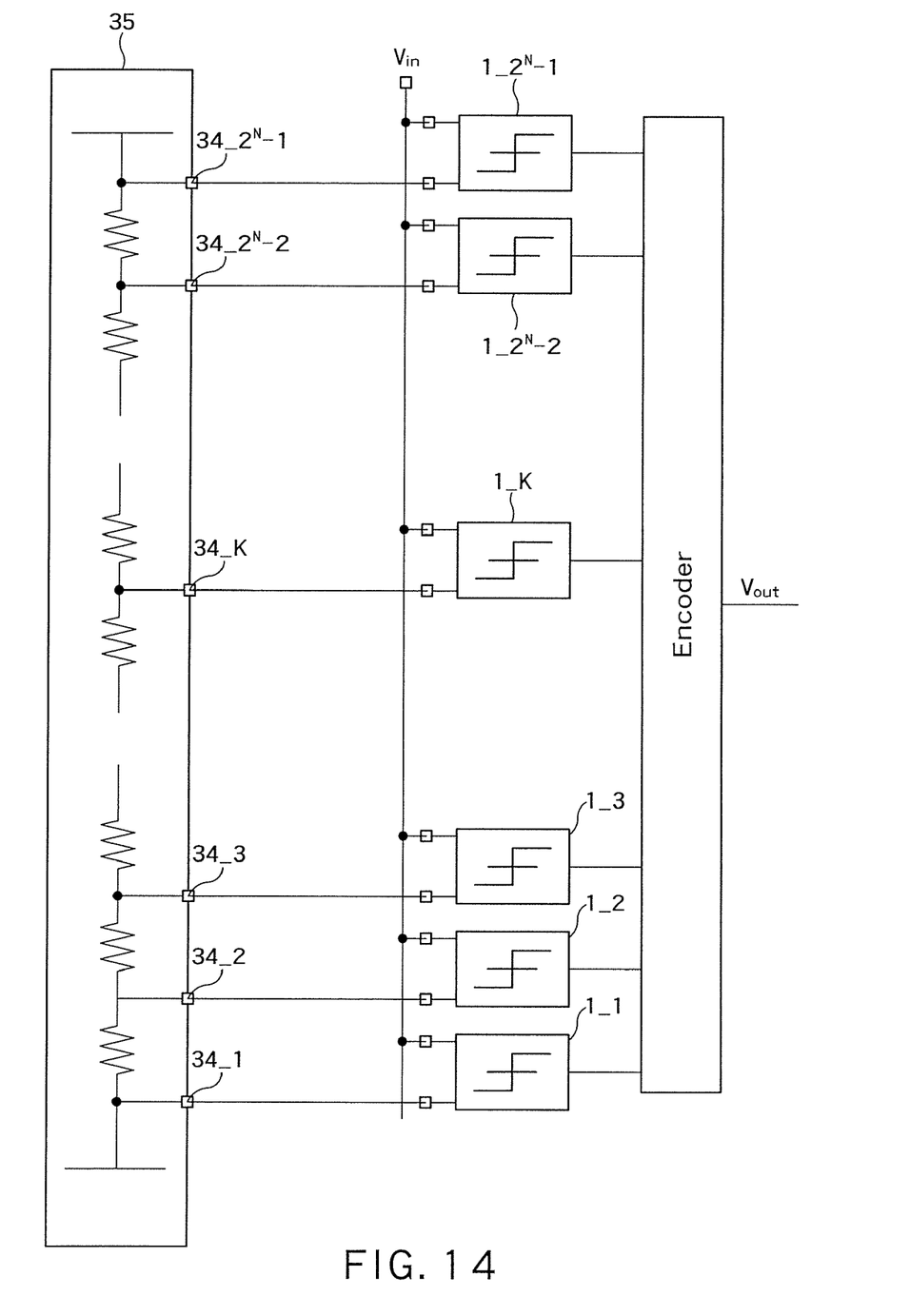
FIG. 14 is a circuit diagram of an ideal N-bit parallel analog-to-digital converter where no DC offset voltage is generated.

FIG. 14 shows an ideal parallel analog-to-digital converter where no DC offset voltage is generated. Even in the ideal case, the respective comparing units require reference voltages from 34_1 to 34_2$^N$−1. Based on comparison between FIG. 13 and FIG. 14, the number of resistors required to be added for the DC offset voltage correction proposed herein is found to be only 2: resistors 34_A and 34_B shown in FIG. 13. Meanwhile, in the case of using the DC offset voltage correction described using FIG. 3, the number of resistors in the resistor series to be used in a reference voltage generating circuit 35 to provide a plurality of reference voltages of 0.1 LSB is almost 10 times that of the case in FIG. 13.

As described above, in the N-bit parallel analog-to-digital converter circuit according to the fifth embodiment, there originally exist the reference voltage generating circuits for analog-to-digital conversion, and the reference voltage generating circuits can be also used for the DC offset voltage correction. The number of resistors to be added can be thereby reduced. Meanwhile, in the case of using the method for correcting a DC offset voltage as described using FIG. 3, a plurality of voltages of 1 LSB or less need to be provided, so that the number of resistors is increased. Accordingly, by carrying out the method for correcting a DC offset voltage according to the fifth embodiment, the circuit area can be substantially decreased.

The invention claimed is:

1. A comparing circuit comprising:
an input terminal configured to receive an input signal;
a first resistor series configured to divide a predetermined voltage range to generate a plurality of first reference voltages;
a first switch controlling circuit configured to select one of the first reference voltages;
a second resistor series configured to divide the predetermined voltage range at intervals larger than intervals of the first reference voltages to generate a plurality of second reference voltages;
a second switch controlling circuit configured to select one of the second reference voltages; and
a comparing unit including a first transistor that generates a current based on the first reference voltage selected by the first switch controlling circuit, a second transistor with a smaller aspect ratio than that of the first transistor that generates a current based on the second reference voltage selected by the second switch controlling circuit, and a third transistor that generates a current based on the input signal, and configured to generate a logical signal representing a logical value by comparing the current from the third transistor with a combined current from the first and second transistors,
wherein the first switch controlling circuit specifies two adjacent first reference voltages where the logical value is inverted by sequentially selecting the first reference voltages in a state in which any one of the second reference voltages is selected by the second switch controlling circuit, and determines to select one of the two adjacent first reference voltages, and
the second switch controlling circuit specifies two adjacent second reference voltages where the logical value is inverted by sequentially selecting the second reference voltages in a state in which the first reference voltage by the first switch controlling circuit is selected, and determines to select one of the two adjacent second reference voltages.

2. The circuit according to claim 1,
wherein the any one of the second reference voltages is a middle voltage in the second reference voltages.

3. The comparing circuit according to claim 1,
wherein a maximum value of a drain current change amount in the second transistor is larger than a minimum value of a current change amount in the first transistor.

4. A parallel analog-to-digital converter, comprising a comparing circuit according to claim 1.

5. A comparing circuit comprising:
an input terminal configured to receive an input signal;
a resistor series configured to divide a predetermined voltage range to generate a plurality of reference voltages;
a first switch controlling circuit configured to select a one of the reference voltages;
a second switch controlling circuit configured to select a one of the reference voltages; and
a comparing unit including a first transistor that generates a current based on the reference voltage selected by the first switch controlling circuit, a second transistor with a smaller aspect ratio than that of the first transistor that generates a current based on the reference voltage selected by the second switch controlling circuit, and a third transistor that generates a current based on the input signal, and configured to generate a logical signal representing a logical value by comparing the current from the third transistor with a combined current from the first and second transistors,
wherein the first switch controlling circuit specifies two adjacent reference voltages where the logical value is inverted by sequentially selecting the reference voltages in a state in which any one of the reference voltages is selected by the second switch controlling circuit, and determines to select one of the two adjacent reference voltages, and
the second switch controlling circuit specifies two adjacent reference voltages where the logical value is inverted by sequentially selecting the reference voltages in a state in which the reference voltage by the first switch controlling circuit is selected, and determines to select one of the two adjacent reference voltages.

6. The circuit according to claim 5,
wherein the second switch controlling circuit determines the reference voltage from among a part of reference voltages placed at constant intervals in the reference voltages generated by the resistor series.

7. The circuit according to claim 5,
wherein the any one of the reference voltages is a middle voltage in the reference voltages.

8. A parallel analog-to-digital converter, comprising a comparing circuit according to claim 5.

* * * * *